(12) United States Patent  
Taheri

(10) Patent No.: US 7,180,171 B1
(45) Date of Patent: Feb. 20, 2007

(54) SINGLE IC PACKAGING SOLUTION FOR MULTI CHIP MODULES

(75) Inventor: Garnik Taheri, San Jose, CA (US)

(73) Assignee: Smart Modular Technologies, Inc., Fremont, CA (US)

( * ) Notice: Subject to any disclaimer, the term of this patent is extended or adjusted under 35 U.S.C. 154(b) by 0 days.

(21) Appl. No.: 10/754,807

(22) Filed: Jan. 8, 2004

(51) Int. Cl.
*H01L 23/12* (2006.01)
(52) U.S. Cl. .................... 257/700; 257/723
(58) Field of Classification Search ............. 257/700, 257/723, 250, 778; 174/250
See application file for complete search history.

(56) References Cited

U.S. PATENT DOCUMENTS

| | | | |
|---|---|---|---|
| 4,408,814 A | 10/1983 | Takashi et al. ............... 439/91 |
| 5,089,877 A | 2/1992 | Queyssac et al. ........... 257/666 |
| 5,191,174 A * | 3/1993 | Chang et al. ............... 174/266 |
| 5,235,496 A | 8/1993 | Chomette et al. ........... 361/764 |
| 5,273,439 A | 12/1993 | Szerlip et al. ................ 439/66 |
| 5,343,075 A | 8/1994 | Nishino ....................... 257/686 |
| 5,655,290 A | 8/1997 | Moresco et al. ............. 29/830 |
| 5,701,032 A | 12/1997 | Fischer et al. .............. 257/692 |
| 5,767,575 A | 6/1998 | Lan et al. .................... 257/701 |
| 5,962,815 A | 10/1999 | Lan et al. .................... 174/262 |
| 5,987,744 A | 11/1999 | Lan et al. ...................... 29/852 |
| 6,014,316 A | 1/2000 | Eide ............................. 361/735 |
| 6,026,564 A | 2/2000 | Wang et al. .................. 29/830 |
| 6,049,467 A | 4/2000 | Tamarkin et al. ........... 361/790 |
| 6,051,878 A | 4/2000 | Akram et al. ............... 257/686 |
| 6,067,234 A | 5/2000 | Kim et al. ................... 361/737 |
| 6,246,015 B1 | 6/2001 | Kim ............................. 174/261 |
| 6,297,458 B1 * | 10/2001 | McMillan et al. .......... 174/250 |
| 6,404,044 B2 | 6/2002 | Akram et al. ............... 257/686 |
| 6,416,333 B1 | 7/2002 | Hasegawa et al. ............ 439/74 |
| 6,448,509 B1 | 9/2002 | Huemoeller ................. 174/262 |
| 6,469,905 B1 | 10/2002 | Hwang ........................ 361/756 |
| 6,545,228 B2 | 4/2003 | Hashimoto .................. 174/260 |
| 6,731,514 B2 | 5/2004 | Evans .......................... 361/790 |
| 2003/0116349 A1 | 6/2003 | Hashimoto .................. 174/260 |

* cited by examiner

*Primary Examiner*—Roy Karl Potter
(74) *Attorney, Agent, or Firm*—Thelen Reid & Priest LLP

(57) ABSTRACT

A multilayer printed circuit board (PCB) interface includes a top PCB layer, a middle PCB layer, and a bottom PCB layer. A top surface of the top PCB layer receives at least one top module. The middle PCB layer includes an electrically conductive layer disposed between two dielectric layers. The electrically conductive layer forms a plurality of connectors protruding horizontally from the sides of the multilayer PCB to couple the PCB interface to a main board. A bottom surface of the bottom PCB layer receives at least one bottom module.

14 Claims, 4 Drawing Sheets

SINGLE IC PACKAGING SOLUTION FOR MULTI CHIP MODULES

FIELD OF THE INVENTION

The present invention relates to integrated circuits (IC) packaging. More particularly, the present invention relates to a single IC packaging supporting a multiple chip packaging technologies.

BACKGROUND OF THE INVENTION

The function of an integrated circuit package is to provide protection of the circuit, distribute power and signals, and dissipate heat. Rapid advances in semiconductor technology have out paced developments in semiconductor packaging techniques. Specifically, increases in the number of signal and power connections on integrated circuits, larger chip sizes, increased power consumption and higher operating frequencies strain the ability of traditional semiconductor packages to provide reliable, cost-effective performance. While some recent advances in packaging technologies have begun to address some of the needs of higher performance integrated circuits, improved packaging technologies are still needed to allow high I/O count and increased density integrated circuits to perform to levels intended by their designers.

Packaging technologies, such as thin quad flat packs (TQFPs), ball grid arrays (BGAs), tape automated bonding (TAB), ultra-thin packages, bare chips or chip-on-board (COB), flip-chip assemblies and multichip modules (MCMs) are now being developed and improved to address performance issues.

In a BGA, in lieu of package pins, an array of solder balls is located on the bottom of a substrate permitting higher I/O counts. BGA yields are almost the same as those for fine-pitch packages. Further, BGA packages will withstand some degree of mishandling without damaging the leads, whereas fine lead parts must be handled with care before soldering so that the leads are not bent or broken. However, BGA packaging has its own downsides such as:

BGAs are more costly to test

BGAs are harder to rework

BGAs require HDI (High Density Interconnect) PCBs which are more expensive.

Currently BGA packaging is the most common technique being used for stacking BGA devices or designing MCMs (Multi Chip Modules).

FIG. 1 illustrates conventional BGA semiconductor packages 102, 104, and 106 coupled to a main board 108. Only one side of each PCB 110, 112, and 114 can be populated while the other side will be used for BGA interconnect balls 116, 118, and 120. Thus, in order to package multiple chips 102 and 104 on the PCB 114, horizontal planar space is needed on the PCB 114. PCB 114 comprises a dielectric substrate (not shown). Conductive traces (not shown) are formed on each side of the substrate to form predetermined circuit patterns on each side of the dielectric substrate. Solder balls 120 are electrically connected to the conductive traces on the bottom surface of the PCB 114.

With BGA packaging, the substrate is limited to the surface on only one side of the PCB since the other side is used for BGA interconnect balls. Thus, no more than one die can be allowed on any single lead frame.

Accordingly, a need exists for a single IC packaging solution for multi chip modules. A primary purpose of the present invention is to solve these needs and provide further, related advantages.

BRIEF DESCRIPTION OF THE INVENTION

A multilayer printed circuit board (PCB) interface includes a top PCB layer, a middle PCB layer, and a bottom PCB layer. A top surface of the top PCB layer receives at least one top module. The middle PCB layer includes an electrically conductive layer disposed between two dielectric layers. The electrically conductive layer forms a plurality of connectors protruding horizontally from the sides of the multilayer PCB to couple the PCB interface to a main board. A bottom surface of the bottom PCB layer receives at least one bottom module.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of integrated circuit (IC) packaging. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

Figure 1:
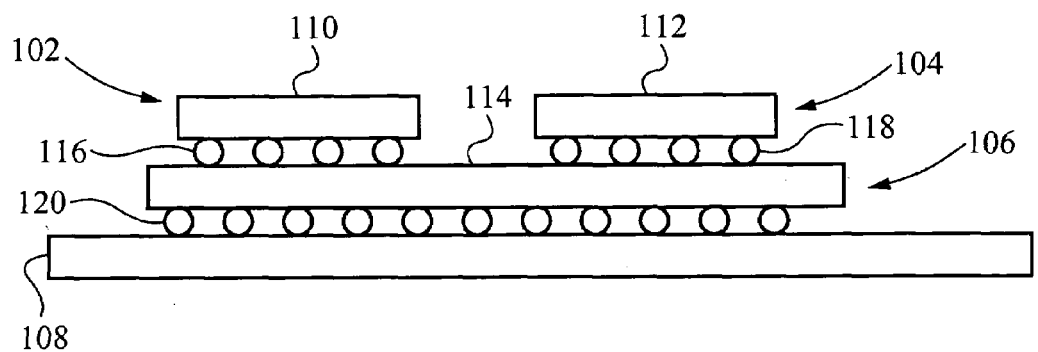
FIG. 1 is a diagram schematically illustrating traditional ball grid array (BGA) packages in accordance with a prior art.
Figure 2A:
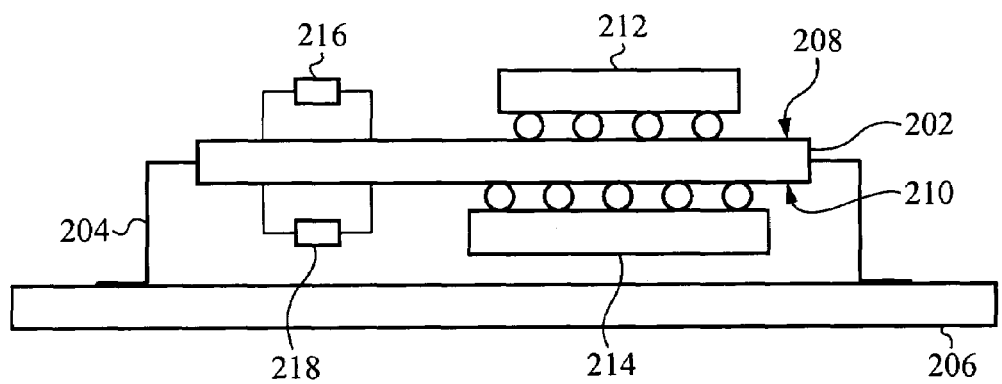
FIG. 2A is a side cross-sectional view diagram schematically illustrating an IC package with multiple modules in accordance with one embodiment of the present invention.
Figure 2B:
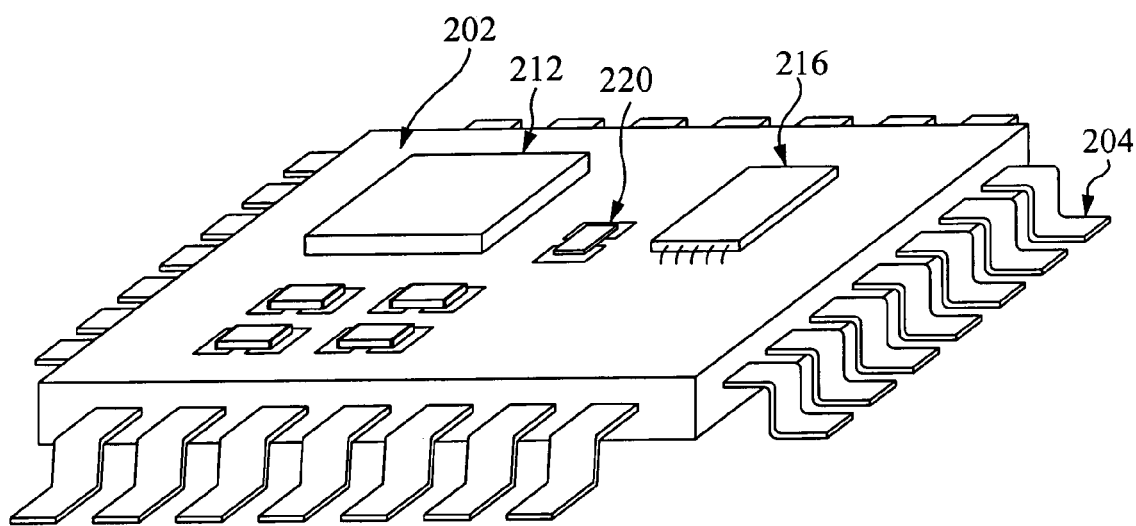
FIG. 2B is a perspective view diagram schematically illustrating an IC package with multiple modules in accordance with one embodiment of the present invention.

With respect to FIG. 2A, a substrate 202 includes electrically conductive material, such as copper, protruding horizontally from the sides of a substrate 202 to form connectors 204 that are electrically coupled to a main board 206. FIG. 2B illustrates a perspective view of the substrate 202 with multiple components on its top surface and bottom surface.

The substrate 202 includes an odd number of PCB layers in which the middle PCB layer comprises a layer of an electrically conductive material, such as heavy copper (for example, 4 ounces per square inch). The layer of electrically conductive material protrudes from the sides of the substrate 202 to form connectors 204. For illustration purposes, the connectors 204 may be further plated with Tin/Nickel to form desired IC package pins. The thickness of the connectors 204 should be compatible with conventional lead frames, i.e. between 4 and 8 mils. FIG. 2 illustrates a TSOP package between the substrate 202 and the main board 206.

The substrate 202 has a top surface 208 of a top PCB layer (not shown) and a bottom surface 210 of a bottom PCB layer (not shown). Both surfaces 208, 210 may be used to receive additional modules with various IC packaging. For example, a BGA device 212 may be mounted on the top surface 208 of the substrate 202. Another BGA device 214 may be mounted on the bottom surface 210 of the substrate 202. Thus both top and bottom sides of the substrate 202 may be used.

Furthermore, the substrate 202 may also be able to accommodate other IC packaging modules such as a TSOP device 216 coupled to the top surface 208 of the substrate 202, and another TSOP device 218 coupled to the bottom surface 210 of the substrate 202. The substrate 202 may thus be able to receive modules of various packaging types. Therefore several different modules may be packaged into a single IC form that would later be piggybacked onto the main board 206 or onto another module (not shown). This would result in reducing the main board's 206 X and Y directions and add a Z dimension instead.

Figure 3B:
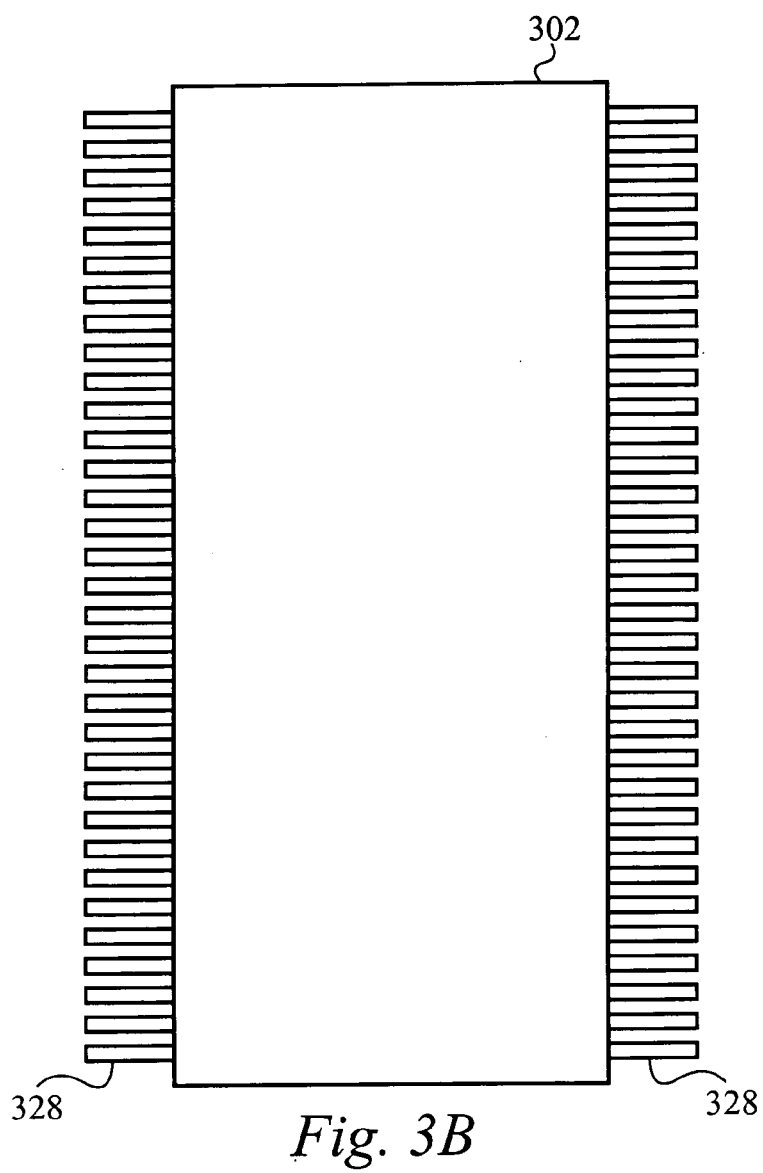
FIG. 3B is a top view diagram schematically illustrating a multilayer PCB interface in accordance with one embodiment of the present invention.
Figure 3A:
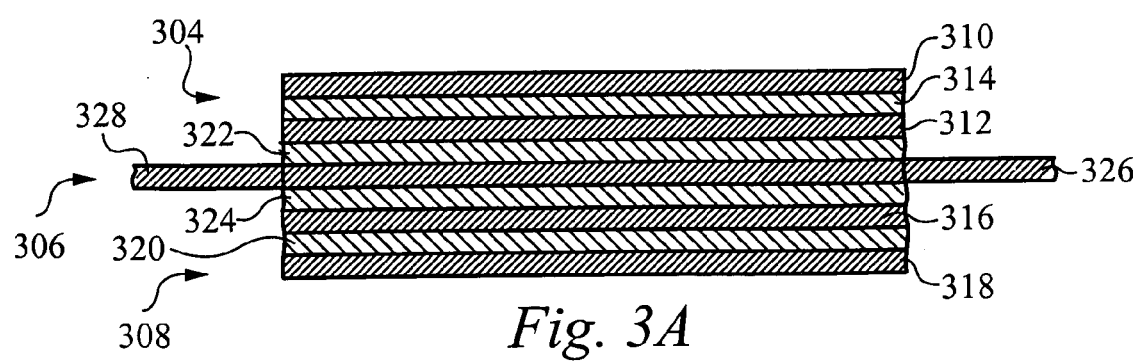
FIG. 3A is a side cross-sectional view diagram schematically illustrating a multilayer PCB interface in accordance with one embodiment of the present invention.

FIG. 3A illustrates a side view of a substrate 302 in accordance with one embodiment of the present invention. FIG. 3B illustrates a top view of the substrate 302. The substrate 302 may include an odd number of PCB layers. For example, FIG. 3A illustrates three PCB layers: a top PCB layer 304, a middle PCB layer 306, and a bottom PCB layer 308. The top PCB layer 304 may include electrically conductive layers 310, 312 on either side of the dielectric core 314. The bottom PCB layer 308 may include electrically conductive layers 316, 318 on either side of the dielectric core 320. The middle PCB layer may comprise dielectric layers 322, 324 on either side of the electrically conductive layer 326. The electrically conductive layer 326 may include heavy copper, such as 4 ounces per square inch. Those of ordinary skill in the art will appreciate that the heavy copper in the electrically conductive layer 326 shown is not intended to be limiting and that other types of electrically conductive material can be used without departing from the inventive concepts herein disclosed. Part of the circuitry of the electrically conductive layer 326 protrudes from sides of the substrate 302 to be later formed to desired IC package pins 328.

The electrically conductive layers 310, 312, 316, 318, and 326 may form conductive traces that communicate with modules that are later mounted on either sides of the substrate 302; the top surface 310 of the top PCB layer 304 and the bottom surface 318 of the bottom PCB layer 308. Thus, both sides of the substrate 302 may be utilized for chip or component placement and can be built in different packages such as TSOP, SOIC, QFP, etc. The substrate 302 may thus act as an interface PCB between the modules the substrate 302 receives and a main board on which the substrate 302 is coupled to.

Figure 4:
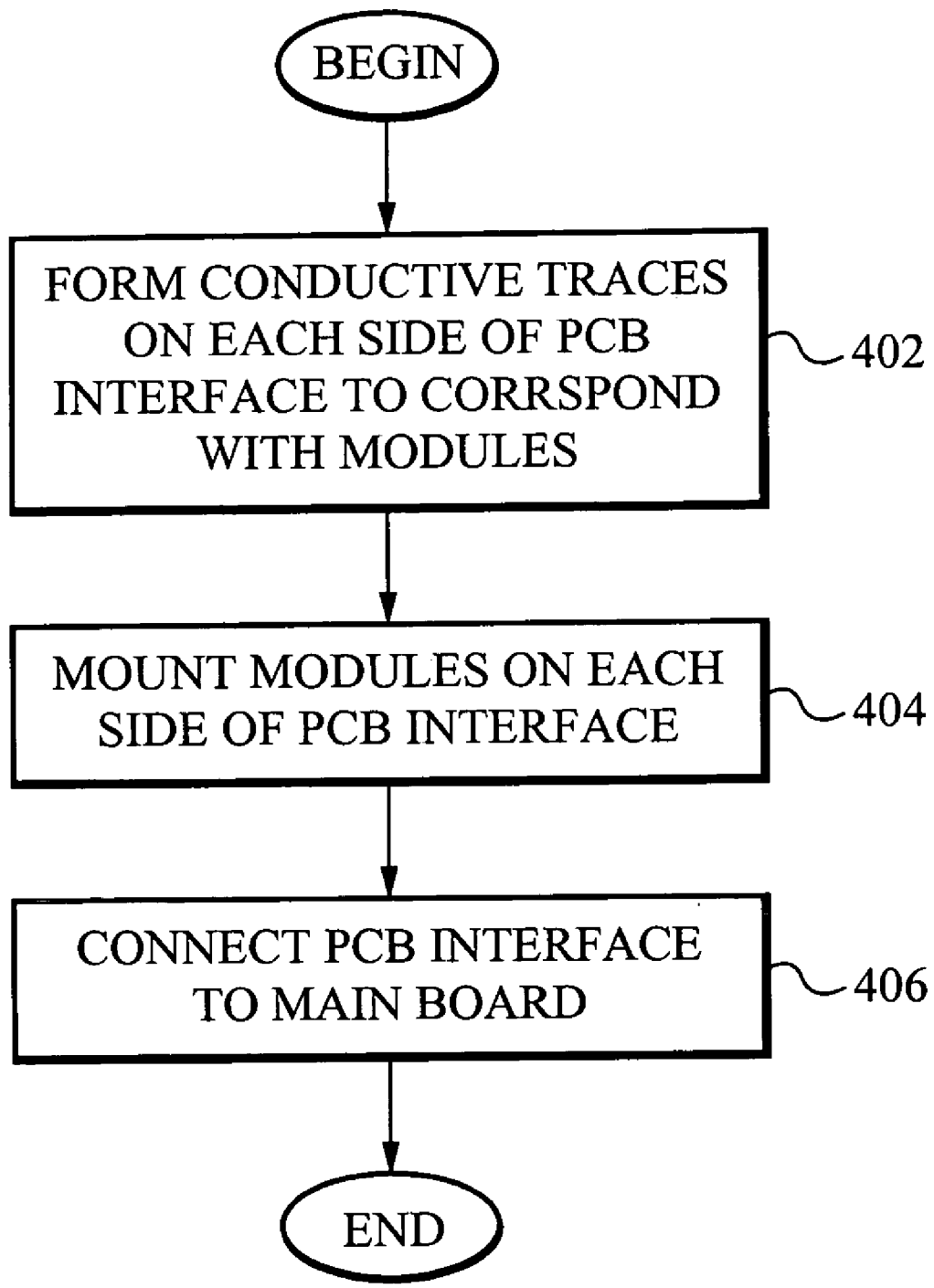
FIG. 4 is a flow diagram illustrating a method for connecting a multilayer PCB to a main board.

FIG. 4 illustrates a method for connecting a multilayer PCB to a main board in which the multilayer PCB includes several types of IC packaging modules mounted on the mulitlayer PCB. The multilayer PCB acts as an interface between the modules it carries and the main board. Those of ordinary skills in the art will recognize that the multilayer PCB may not be necessarily directly mounted on the main board but may be mounted on other modules or components as well. At 402, electrically conductive traces are formed on either side of the multilayer PCB interface to correspond with modules that will be mounted on the multilayer PCB.

The multilayer PCB may include several PCB layers with a middle layer being electrically conductive. The electrically conductive middle layer protrudes from the sides of the multiplayer PCB to form connectors, such as pins, that will interface with another module or the main board.

At 404, modules are mounted on either or both sides of the multilayer PCB. Various packaging technologies may be used to mount the modules to the multilayer PCB. Thus, both sides of the multilayer PCB may be utilized for chip or component placement and can be built in different packages such as TSOP, SOIC, QFP, etc.

Once the modules are mounted on the multilayer PCB, the multilayer PCB may be connected to the main board at 406. Those of ordinary skills in the art will recognize that the multilayer PCB may not be necessarily directly mounted on the main board but may be mounted on other modules or components as well.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A multilayer printed circuit board (PCB) interface comprising:
   a top PCB layer, a top surface of said top PCB layer for receiving at least one top module;
   a middle PCB layer including an electrically conductive layer disposed between two dielectric layers, said electrically conductive layer forming a plurality of connectors protruding horizontally for coupling the PCB interface to a main board; and
   a bottom PCB layer, a bottom surface of said bottom PCB layer for receiving at least one bottom module.

2. The multilayer PCB of claim 1 wherein said top PCB layer further includes a top electrically conductive layer, a dielectric core, and a bottom electrically conductive layer.

3. The multilayer PCB of claim 2 wherein said top electrically conductive layer includes a plurality of traces forming a predetermined circuit pattern.

4. The multilayer PCB of claim 1 wherein said bottom PCB layer includes a top electrically conductive layer, a dielectric core, and a bottom electrically conductive layer.

5. The multilayer PCB of claim 4 wherein said bottom electrically conductive layer includes a plurality of traces forming a predetermined circuit pattern.

6. The multilayer PCB of claim 1 wherein said top surface of said top PCB layer is configured to receive a plurality of packaging technologies.

7. The multilayer PCB of claim 1 wherein said bottom surface of said bottom PCB layer is configured to receive a plurality of packaging technologies.

8. The multilayer PCB of claim 1 wherein said electrically conductive layer includes copper having a density of about 5 ounces per square inch.

9. The multilayer PCB of claim 1 wherein said plurality of connectors forms a TSOP connection with a surface of said main board.

10. A multichip IC packaging comprising:
    a multilayer PCB having a top surface, a bottom surface, and a middle electrically conductive layer forming a plurality of connectors protruding horizontally from said multilayer PCB, said plurality of connectors for coupling to a main board;
    a first plurality of modules coupled on said top surface; and
    a second plurality of modules coupled on said bottom surface.

11. A multilayer printed circuit board (PCB) interface comprising:
    means for receiving at least one top module;
    means for receiving at least one bottom module; and
    means for coupling the PCB interface to a main board, wherein said means for coupling protrudes from the PCB interface.

12. The multilayer PCB of claim 11 wherein said at least one top module includes a plurality of packaging technologies.

13. The multilayer PCB of claim 11 wherein said at least one bottom module includes a plurality of packaging technologies.

14. The multilayer PCB of claim 11 wherein said means for coupling includes a TSOP connection with said main board.

* * * * *